(12) United States Patent
Sekine

(10) Patent No.: US 10,468,376 B2
(45) Date of Patent: Nov. 5, 2019

(54) SEMICONDUCTOR DEVICE AND METHOD FOR MANUFACTURING THE SAME

(71) Applicant: NAPRA CO., LTD., Katsushika-Ku, Tokyo (JP)

(72) Inventor: Shigenobu Sekine, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 15/906,099

(22) Filed: Feb. 27, 2018

(65) Prior Publication Data

US 2018/0269179 A1    Sep. 20, 2018

(30) Foreign Application Priority Data

Mar. 14, 2017 (JP) ................... 2017-048518

(51) Int. Cl.
*H01L 23/00* (2006.01)
*H01L 23/29* (2006.01)
(Continued)

(52) U.S. Cl.
CPC .............. *H01L 24/85* (2013.01); *H01L 21/56* (2013.01); *H01L 23/293* (2013.01);
(Continued)

(58) Field of Classification Search
CPC ... H01L 24/85; H01L 23/295; H01L 23/3107; H01L 23/3135; H01L 24/48; H01L 21/56; H01L 23/293; H01L 2224/48011; H01L 24/32; H01L 24/45; H01L 24/73; H01L 24/78; H01L 2224/32245; H01L 2224/45124; H01L 2224/45144; H01L 2224/45147; H01L 2224/78301; H01L 2224/85045; H01L 2224/85181; H01L 2224/8592; H01L 2924/00014; H01L 2924/15747; H01L 2924/1576; H01L 2924/181; H01L 2224/48247;
(Continued)

(56) References Cited

U.S. PATENT DOCUMENTS 7,195,954 B2 * 3/2007 Lamson .............. H01L 23/4952
257/E23.025
9,691,519 B2    6/2017 Sekine et al.
(Continued)

FOREIGN PATENT DOCUMENTS

JP    H04-65840 A    3/1992
JP    H04-217334 A    8/1992
(Continued)

*Primary Examiner* — Su C Kim
(74) *Attorney, Agent, or Firm* — Carrier Blackman & Associates, P.C.; Joseph P. Carrier; Anne G. Sabourin

(57) ABSTRACT

Disclosed is a semiconductor device that includes a semiconductor chip; bonding pads provided to the semiconductor chip; a plurality of lead terminals arranged around the semiconductor chip; a plurality of bonding wires that electrically connect the semiconductor chip with the plurality of lead terminals; and a resin encapsulant which encapsulates the semiconductor chip and the bonding wires, the semiconductor device further having an insulating material interposed at the interface between the bonding wires and the resin encapsulant, and the insulating material containing a nanometer-sized insulating particle and amorphous silica.

3 Claims, 1 Drawing Sheet

(51) Int. Cl.
*H01L 21/56* (2006.01)
*H01L 23/31* (2006.01)

(52) U.S. Cl.
CPC ........ *H01L 23/295* (2013.01); *H01L 23/3107* (2013.01); *H01L 23/3135* (2013.01); *H01L 24/48* (2013.01); H01L 24/05 (2013.01); H01L 24/32 (2013.01); H01L 24/45 (2013.01); H01L 24/73 (2013.01); H01L 24/78 (2013.01); H01L 2224/04042 (2013.01); H01L 2224/32245 (2013.01); H01L 2224/45124 (2013.01); H01L 2224/45144 (2013.01); H01L 2224/45147 (2013.01); H01L 2224/48011 (2013.01); H01L 2224/48091 (2013.01); H01L 2224/48247 (2013.01); H01L 2224/48465 (2013.01); H01L 2224/73265 (2013.01); H01L 2224/78301 (2013.01); H01L 2224/85007 (2013.01); H01L 2224/85035 (2013.01); H01L 2224/85045 (2013.01); H01L 2224/85047 (2013.01); H01L 2224/8592 (2013.01); H01L 2224/85181 (2013.01); H01L 2224/85205 (2013.01); H01L 2924/00014 (2013.01); H01L 2924/1576 (2013.01); H01L 2924/15747 (2013.01); H01L 2924/181 (2013.01)

(58) Field of Classification Search
CPC . H01L 2224/73265; H01L 2224/04042; H01L 2224/85205; H01L 2224/48091; H01L 24/05; H01L 2224/85007; H01L 2224/85047; H01L 2224/85035; H01L 2224/48465

See application file for complete search history.

(56) References Cited

U.S. PATENT DOCUMENTS

| | | |
|---|---|---|
| 9,735,074 B1 | 8/2017 | Sekine |
| 2001/0017221 A1* | 8/2001 | Horiuchi ............ H01L 21/4885 174/260 |
| 2009/0032972 A1* | 2/2009 | Okubo ............... H01L 23/3121 257/777 |
| 2009/0306272 A1* | 12/2009 | Nishi .................... C01B 33/126 524/493 |
| 2010/0164083 A1* | 7/2010 | Yim .................... H01L 23/3135 257/686 |
| 2015/0102478 A1* | 4/2015 | Suthiwongsunthorn .................... H01L 24/45 257/680 |

FOREIGN PATENT DOCUMENTS

| | | |
|---|---|---|
| JP | H05-74831 A | 3/1993 |
| JP | 2014-107352 A | 6/2014 |
| JP | 6006895 B1 | 10/2016 |

\* cited by examiner

SEMICONDUCTOR DEVICE AND METHOD FOR MANUFACTURING THE SAME

INCORPORATION BY REFERENCE

This application is based on Japanese Patent Application No. 2017-048518, filed on Mar. 14, 2017, the content of which is incorporated hereinto by reference.

BACKGROUND OF THE INVENTION

1. Field of the Invention

This invention relates to a semiconductor device and a method for manufacturing the same.

2. Description of the Related Art

FIG. 1 is a schematic cross-sectional view illustrating an ordinary semiconductor device.

A semiconductor device 101 has a semiconductor chip 2, bonding pads 211 provided to the semiconductor chip 2, a plurality of lead terminals 50 arranged around the semiconductor chip 2, a plurality of bonding wires 6 that electrically connect the semiconductor chip 2 with the lead terminals 50, and a resin encapsulant 11 that encapsulates these components. The semiconductor device 101 typically measures approximately 4 mm×4 mm in planar view, and is typically 1 mm thick or thinner.

Further details will be given below.

The lead frame 4 has a die pad 40 disposed at the center, in bottom view, of the semiconductor device 101, and the plurality of lead terminals 50 arranged so as to surround the die pad 40 while keeping a gap in between. The top surface 41 of the die pad 40 is flush with the top surfaces 51 of the lead terminals 50. The lead frame 4 is typically made of a Cu sheet metal or Fe—Ni alloy sheet metal of approximately 200 μm thick, which is formed by punching, etching, or the like.

The semiconductor chip 2, whose surface 21 having the bonding pads 211 formed thereon directed upward, is bonded on the back surface 22 thereof to the die pad 40 while placing a bonding material 3 in between.

To each of the bonding pads 211, there is bonded one end of each bonding wire 6. The other end of each bonding wire 6 is bonded to the top surface 51 of the lead terminal 50. In this way, the semiconductor chip 2 is electrically connected through the bonding wires 6 to the lead terminals 50. Each bonding wire 6 has a length correspondent to the distance between each bonding pad 211 and each lead terminal 50, where the distance between each electrode pad 211 and each lead terminal 50 is typically 500 μm to 800 μm.

The bonding wires 6 may be formed by any of known methods including ball bonding. First, voltage is applied to the end of the bonding wire 6 held in a capillary of a wire bonder, to form a FAB (Free Air Ball) at the end. The capillary is then brought down to press the FAB against the bonding pad 211, and ultrasonic energy is applied. The FAB is deformed to produce a first bonded portion with a shape of flattened ball, thereby first bonding is finished. The capillary is then moved so as to draw the bonding wire 6 away from the circumference of the semiconductor chip 2, the tail of wire held by the capillary is pressed against the top surface 51 of the lead terminal 50 and bonded thereto under supply of ultrasonic energy, and the wire is then torn off. In this way, a second bonding potion with a shape of wedge when viewed from the side is formed on the lead terminal 50, thereby second bonding is finished.

After completion of the entire process of wire bonding, the lead frame 4 is placed in a molding die, and the semiconductor chip 2 and the bonding wires 6 are encapsulated en bloc, together with necessary portions of the lead frame 4 and the die pad 40, using the resin encapsulant.

The conventional semiconductor device has however suffered from poor adhesiveness between the bonding wires 6 and the resin encapsulant 11 typically composed of an epoxy resin, causing separation between the bonding wires 6 and the resin encapsulant 11. Such event is more likely to occur particularly when the resin encapsulant is moistened depending on external environmental conditions, and particularly when the bonding wire 6 is made of Au. Note that the epoxy resin is known to be hygroscopic.

Now, the first bonding portion formed by the first bonding has a flattened ball-like shape as described above, and therefore excels in adhesiveness to the bonding pad 211. In contrast, the second bonding portion formed by the second bonding has a wedge-like shape when viewed from the side, and each bonding wire 6 is bonded to the top surface 51 of each lead terminal 50 at an angle of inclination θ, posing a risk of causing bonding failure between the bonding wires 6 and the lead terminals 50.

JP-A-2014-107352 discloses an insulating paste that contains an insulating particle, Si particle, and an organosilicon compound. JP-A-2014-107352 however neither discloses nor implies any technical idea regarding enhancement of adhesiveness between the resin encapsulant 11 and the bonding wire 6 by interposing the insulating paste at the interface between them, or regarding enhancement of bonding between the bonding wires 6 and the lead terminals 50 in the second bonding.

SUMMARY OF THE INVENTION

It is therefore an object of this invention to provide a semiconductor device and a method for manufacturing the same, capable of enhancing adhesiveness between the bonding wires and the resin encapsulant enough to prevent separation of them, and of improving bonding strength between the bonding wires and the lead terminals in the second bonding.

The present inventor found from its thorough examination that the above-described problem may be solved by placing the insulating paste, disclosed in JP-A-2014-107352, at the interface between the bonding wires and the resin encapsulant. The finding led the inventor to complete this invention. The invention of 2014-107352 has already been granted a patent as Japanese Patent No. 5281188.

This invention is given as below.

(1) A semiconductor device which includes:
 a semiconductor chip;
 bonding pads provided to the semiconductor chip;
 a plurality of lead terminals arranged around the semiconductor chip;
 a plurality of bonding wires that electrically connect the semiconductor chip with the plurality of lead terminals; and
 a resin encapsulant which encapsulates the semiconductor chip and the bonding wires,
 the semiconductor device further having an insulating material interposed at the interface between the bonding wires and the resin encapsulant, and
 the insulating material containing a nanometer-sized insulating particle and amorphous silica.

(2) A method for manufacturing the semiconductor device described in (1), the method includes, after electrically connecting the semiconductor chip and the plurality of lead terminals through a plurality of bonding wires and before encapsulation with the resin encapsulant, bringing at least the bonding wires into contact with an insulating paste that contains a nanometer-sized insulating particle and an organosilicon compound.

(3) The method for manufacturing the semiconductor device described in (2), wherein the organosilicon compound is an alkyl alkoxy silane or an organopolysiloxane.

DESCRIPTION OF THE EMBODIMENTS

The semiconductor device of this invention may cover a whole range of conventional semiconductor devices, provided that an insulating material explained below is interposed between the bonding wires and the resin encapsulant.

Figure 1:
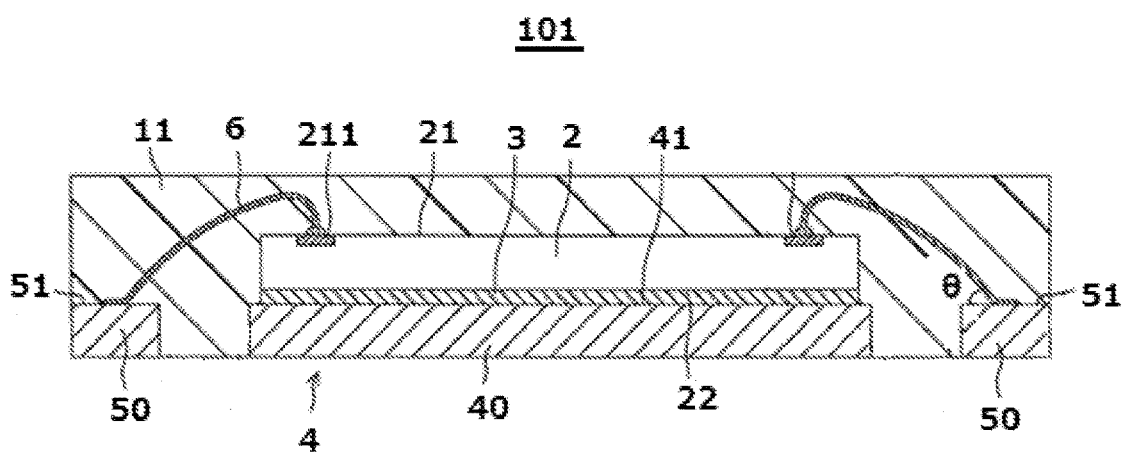
FIG. 1 is a schematic cross-sectional view illustrating a widely-known semiconductor device.

Such semiconductor device may be typically embodied as the semiconductor device 101 previously illustrated in FIG. 1, which has a semiconductor chip 2, bonding pads 211 provided to the semiconductor chip 2, a plurality of lead terminals 50 arranged around the semiconductor chip 2, a plurality of bonding wires 6 that electrically connect the semiconductor chip 2 with the lead terminals 50, and a resin encapsulant 11 that encapsulates these components.

To interpose the insulating material at the interface between the bonding wires 6 and the resin encapsulant 11, it suffices to bring the bonding wires 6 into contact with an insulating paste that contains a nanometer-sized insulating particle and an organosilicon compound, after electrically connecting the semiconductor chip 2 and the plurality of lead terminals 50 through the plurality of bonding wires 6, and before encapsulation with the resin encapsulant.

The insulating paste contains the nanometer-sized insulating particle and amorphous silica. The "nanometer size" in the context of this invention means a size of 1 μm or smaller.

Figure 2:
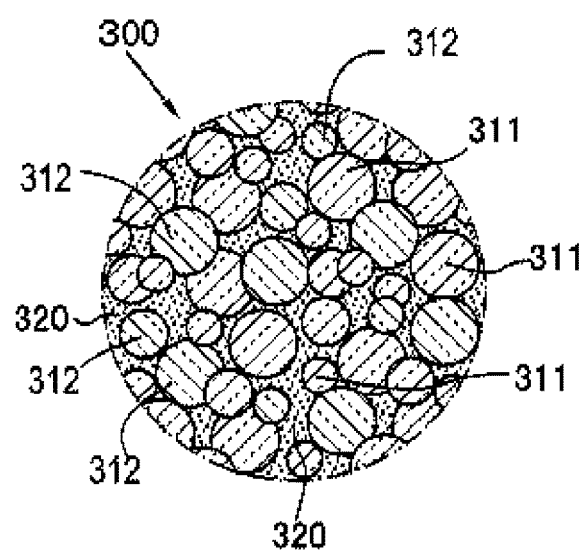
FIG. 2 is a drawing illustrating an insulating paste used in this invention.

Referring now to FIG. 2, an insulating paste 300 used in this invention contains insulating particles 311, and preferably contains Si particles 312, and a liquid organosilicon compound 320. The organosilicon compound 320, when allowed to react with the Si particles 312, forms Si—O bonds (amorphous silica ($SiO_2$)) around the insulating particles 311 which serve as an aggregate.

Each of the insulating particle 311 and Si particle 312 has a particle size on the nanometer scale (1 μm or smaller). External forms of the insulating particle 311 and the Si particle 312 are freely selectable without being limited to sphere, although illustrated as spheres in FIG. 1.

The insulating particle 311 is exemplified by metal oxide particles (ceramic particles) composed of barium titanate, silica, alumina and so forth. The insulating particle 311 need not have a uniform particle size, but may have different particle sizes within the nanometer scale described above.

The Si particle 312 is an optional ingredient, but is beneficial for demonstrating the effects of this invention.

The Si particle 312 need not have a uniform particle size, but may have different particle sizes within the nanometer scale described above.

The organosilicon compound 320 is represented by an alkyl alkoxy silane given by the formula below:

$$CH_3O-[Si_nO_{n-1}(CH_3)_n(OCH_3)_n]-CH_3.$$

Besides this, employable is an organopolysiloxane (for example, alkoxy silane having a functional side chain), which is specifically exemplified by compounds having alkoxy group(s) (RO) bound to a Si atom or tetrasiloxane, where R represents an organic group.

To bring the insulating paste 300 into contact with the bonding wires 6, employable is a method by which, before the semiconductor chip 2 and the plurality of lead terminals 50 are electrically connected through the plurality of bonding wires 6, and before encapsulation with the resin encapsulant 11, these components are dipped in a dipping tank that contains an insulating paste, or these components are sprayed with the insulating paste. After the process, the components are preferably air-dried or dried under heating. Thickness of coating of the insulating paste is typically, but not specifically limited to, 100 nm or thinner.

The components thus coated with the insulating paste is then encapsulated with the resin encapsulant 11. Epoxy resin is typically used as the resin encapsulant. Any of known methods for encapsulation is employable, by which the components are typically placed in a mold, the resin is filled into the mold, and the resin is allowed to cure.

The thus obtained semiconductor device of this invention has the insulating material disposed at the interface between the bonding wires 6 and the resin encapsulant 11, thereby enjoys improved adhesiveness between the bonding wires 6 and the resin encapsulant 11, while preventing separation of both components.

Also the bonding strength between the bonding wires 6 and the lead terminals 50, during the second bonding, is advantageously improved.

While the bonding wires 6 are exemplified by known wires made of Au, Al, Cu and so forth, effects of this invention may be particularly be enhanced when Au wires are used. While the resin encapsulant is again not specifically limited, effects of this invention may be enhanced particularly when epoxy resin is used as the resin encapsulant.

Electronic devices incorporating the semiconductor device of this invention cover almost all devices that contain electronic circuits as the functional elements thereof, which are exemplified by sensor module, optoelectronic module, unipolar transistor, MOS FET, CMOS FET, memory cell, or, integrated circuit (IC) incorporating these components, and LSIs of various scales.

Experiments below were conducted to demonstrate the effects of this invention.

Preparation of Insulating Paste

Barium titanate as the insulating particle, Si particle, and organopolysiloxane represented by formula $CH_3O-[Si_nO_{n-1}(CH_3)_n(OCH_3)_n]-CH_3$ were mixed to thereby prepare an insulating paste.

A semiconductor device before being encapsulated with the resin encapsulant was dipped in the insulating paste, and air-dried. The semiconductor device was then placed in a predetermined die, and encapsulated with an epoxy resin.

Now, the semiconductor device of this example has, as illustrated in FIG. 1, the semiconductor chip 2; bonding pads 211 provided to the semiconductor chip 2; the plurality of lead terminals 50 arranged around the semiconductor chip 2; the plurality of bonding wires 6 that electrically connect the semiconductor chip 2 with the lead terminals 50; and the resin encapsulant 11 that encapsulates these components. The bonding wires 6 are Au wires, the semiconductor chip 2 typically measures approximately 4 mm×4 mm in planar view, the distance between each electrode pad 211 and each lead terminal 50 is approximately 500 µm, and each bonding wire 6 is bonded to the top surface 51 of each lead terminal 50 at a certain angle of inclination.

Adhesiveness between the bonding wires 6 and the resin encapsulant 11 was examined. The bonding wires 6 and the resin encapsulant 11 were found to remain under good adhesion even after the experiment, without showing separation between them. In contrast, separation between the bonding wires 6 and the resin encapsulant 11 was observed for a semiconductor device not having been brought into contact with the insulating paste.

Bonding between the bonding wires 6 and the lead terminal 50 during the second bonding was observed. The state of bonding was found to remain intact in the semiconductor device of this invention having been brought into contact with the insulating paste, whereas a plurality of bonding wires 6 were found to be separated from the lead terminals 50 in the semiconductor device not having been brought into contact with the insulating paste.

According to this invention, it now becomes possible to provide a semiconductor device and a method for manufacturing the same, capable of enhancing adhesiveness between the bonding wires and the resin encapsulant enough to prevent separation of them, and of improving bonding strength between the bonding wires and the lead terminals in the second bonding.

What is claimed is:

1. A method for manufacturing a semiconductor device comprising:
   providing
      a semiconductor chip;
      bonding pads having a surface coplanar with the semiconductor chip;
      a plurality of lead terminals arranged around the semiconductor chip;
      a plurality of bonding wires that electrically connect to the semiconductor chip via the bonding pads and connect the semiconductor chip with the plurality of lead terminals; and
      a resin encapsulant, composed of an epoxy resin, which encapsulates the semiconductor chip and the bonding wires;
   contacting at least the bonding wires with an insulating material; and
   electrically connecting the semiconductor chip and the plurality of lead terminals through a plurality of bonding wires;
   encapsulating the semiconductor with the resin encapsulant after contacting at least the bonding wires with the insulating material;
      wherein the insulating material contains an insulating particle having a particle size of 1 µm or smaller, amorphous silica, and an organosilicon compound consisting of one of an alkyl alkoxy silane compound, and an organopolysiloxane; and the organosilicon reacts with the Si particles to form Si—O bonds around the insulating particles, and
   a thickness of the insulating material is 100 nm or less.

2. The method for manufacturing the semiconductor device described in claim 1,
   wherein the method comprises, after electrically connecting the semiconductor chip and the plurality of lead terminals through a plurality of bonding wires and before encapsulation with the resin encapsulant,
contacting at least the bonding wires with the insulating material.

3. The method for manufacturing the semiconductor device of claim 1, wherein the organosilicon compound is an alkyl alkoxy silane.

* * * * *